(12) United States Patent
Shen et al.

(10) Patent No.: US 11,552,052 B2
(45) Date of Patent: Jan. 10, 2023

(54) STATIC RANDOM ACCESS MEMORY (SRAM) AND METHOD FOR FABRICATING THE SAME

(71) Applicant: UNITED MICROELECTRONICS CORP., Hsin-Chu (TW)

(72) Inventors: Yen-Yu Shen, Tainan (TW); Tsung-Hsun Wu, Kaohsiung (TW); Liang-Wei Chiu, Pingtung County (TW); Shih-Hao Liang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 84 days.

(21) Appl. No.: 16/848,848

(22) Filed: Apr. 15, 2020

(65) Prior Publication Data

US 2021/0296286 A1 Sep. 23, 2021

(30) Foreign Application Priority Data

Mar. 17, 2020 (TW) .................................. 109108803

(51) Int. Cl.
| | |
|---|---|
| *H01L 25/065* | (2006.01) |
| *H01L 23/00* | (2006.01) |
| *H01L 23/535* | (2006.01) |
| *H01L 21/8234* | (2006.01) |
| *H01L 25/00* | (2006.01) |

(52) U.S. Cl.
CPC .. *H01L 25/0657* (2013.01); *H01L 21/823475* (2013.01); *H01L 23/535* (2013.01); *H01L 24/08* (2013.01); *H01L 24/80* (2013.01); *H01L 25/50* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/1437* (2013.01)

(58) Field of Classification Search
None
See application file for complete search history.

(56) References Cited

U.S. PATENT DOCUMENTS

| | | | |
|---|---|---|---|
| 6,734,479 B1 * | 5/2004 | Ogishima | H01L 27/10873 257/296 |
| 9,153,495 B2 * | 10/2015 | Aoki | H01L 21/76251 |
| 9,761,302 B1 * | 9/2017 | Lu | G11C 8/16 |

(Continued)

FOREIGN PATENT DOCUMENTS

| | | | | |
|---|---|---|---|---|
| WO | WO-0033382 A1 * | 6/2000 | | H01L 27/108 |
| WO | WO-2017052594 A1 * | 3/2017 | | H01L 21/823807 |

*Primary Examiner* — Telly D Green
(74) *Attorney, Agent, or Firm* — Winston Hsu (57) ABSTRACT

A semiconductor device includes a first metal-oxide semiconductor (MOS) transistor on a first substrate, a first interlayer dielectric (ILD) layer on the first MOS transistor, a second substrate on the first ILD layer, and a second MOS transistor on a second substrate. Preferably, the semiconductor device includes a static random access memory (SRAM) and the SRAM includes a first pull-up device, a second pull-up device, a first pull-down device, a second pull-down device, a first pass-gate device, a second pass-gate device, a read port pull-down device, and a read port pass-gate device, in which the read port pull-down device includes the first MOS transistor and the read port pass-gate device includes the second MOS transistor.

20 Claims, 4 Drawing Sheets

(56) References Cited

U.S. PATENT DOCUMENTS

| | | | |
|---|---|---|---|
| 9,793,243 B2 * | 10/2017 | Lu | H01L 25/0657 |
| 10,510,723 B2 * | 12/2019 | Lu | H01L 21/76877 |
| 10,847,521 B2 * | 11/2020 | Huang | H01L 29/0847 |
| 11,270,978 B2 * | 3/2022 | Lu | H01L 23/528 |
| 2001/0054727 A1 * | 12/2001 | Hofmann | H01L 27/108 257/296 |
| 2002/0102816 A1 * | 8/2002 | Gonzalez | H01L 21/76254 438/455 |
| 2002/0119640 A1 * | 8/2002 | Gonzalez | H01L 25/0657 257/E21.507 |
| 2010/0259971 A1 * | 10/2010 | Liaw | G11C 8/16 365/154 |
| 2011/0068413 A1 * | 3/2011 | Liaw | H01L 27/1104 257/393 |
| 2011/0317485 A1 * | 12/2011 | Liaw | G11C 8/16 365/182 |
| 2013/0154027 A1 * | 6/2013 | Liaw | H01L 27/0207 257/390 |
| 2013/0285180 A1 * | 10/2013 | Wang | H01L 27/14683 257/E31.127 |
| 2013/0334638 A1 * | 12/2013 | Chen | H01L 27/14634 257/E31.127 |
| 2016/0055902 A1 * | 2/2016 | Chen | G11C 11/412 365/72 |
| 2017/0032835 A1 * | 2/2017 | Liaw | G11C 5/02 |
| 2017/0243861 A1 * | 8/2017 | Wang | H01L 27/0207 |
| 2017/0338208 A1 * | 11/2017 | Letowski | H01L 23/3735 |
| 2018/0005977 A1 * | 1/2018 | Lin | H01L 24/02 |
| 2018/0138185 A1 * | 5/2018 | Hsu | H01L 21/823878 |
| 2018/0190344 A1 * | 7/2018 | Tseng | G11C 11/418 |
| 2019/0081050 A1 * | 3/2019 | Liaw | G11C 8/16 |
| 2019/0296081 A1 * | 9/2019 | Sharma | H01L 45/144 |
| 2020/0083232 A1 * | 3/2020 | Huang | H01L 29/0847 |
| 2020/0118977 A1 * | 4/2020 | Lu | H01L 24/09 |
| 2020/0203432 A1 * | 6/2020 | Rachmady | H01L 51/102 |
| 2020/0266200 A1 * | 8/2020 | Lo | H01L 27/0924 |

* cited by examiner

STATIC RANDOM ACCESS MEMORY (SRAM) AND METHOD FOR FABRICATING THE SAME

BACKGROUND OF THE INVENTION

1. Field of the Invention

The invention relates to a method for fabricating semiconductor device, and more particularly, to a method for fabricating static random access memory (SRAM).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer system as a cache memory.

Even though current SRAM devices possess the advantage of having faster operating speed than conventional memory devices, the area occupied by current SRAM devices are significantly large resulting in waste of space. Hence how to provide a better SRAM architecture for resolving this issue has become an important task in this field.

SUMMARY OF THE INVENTION

According to an embodiment of the present invention, a method for fabricating semiconductor device includes the steps of: forming a first metal-oxide semiconductor (MOS) transistor on a first substrate; forming a first interlayer dielectric (ILD) layer on the first MOS transistor; and forming a second MOS transistor on the first ILD layer. Preferably, the semiconductor device comprises a static random access memory (SRAM) and the SRAM includes a first pull-up device, a second pull-up device, a first pull-down device, a second pull-down device, a first pass-gate device, a second pass-gate device, a read port pull-down device, and a read port pass-gate device, in which the read port pull-down device includes the first MOS transistor and the read port pass-gate device includes the second MOS transistor.

According to another aspect of the present invention, a semiconductor device includes a first metal-oxide semiconductor (MOS) transistor on a first substrate, a first interlayer dielectric (ILD) layer on the first MOS transistor, a second substrate on the first ILD layer, and a second MOS transistor on a second substrate. Preferably, the semiconductor device includes a static random access memory (SRAM) and the SRAM includes a first pull-up device, a second pull-up device, a first pull-down device, a second pull-down device, a first pass-gate device, a second pass-gate device, a read port pull-down device, and a read port pass-gate device, in which the read port pull-down device includes the first MOS transistor and the read port pass-gate device includes the second MOS transistor.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
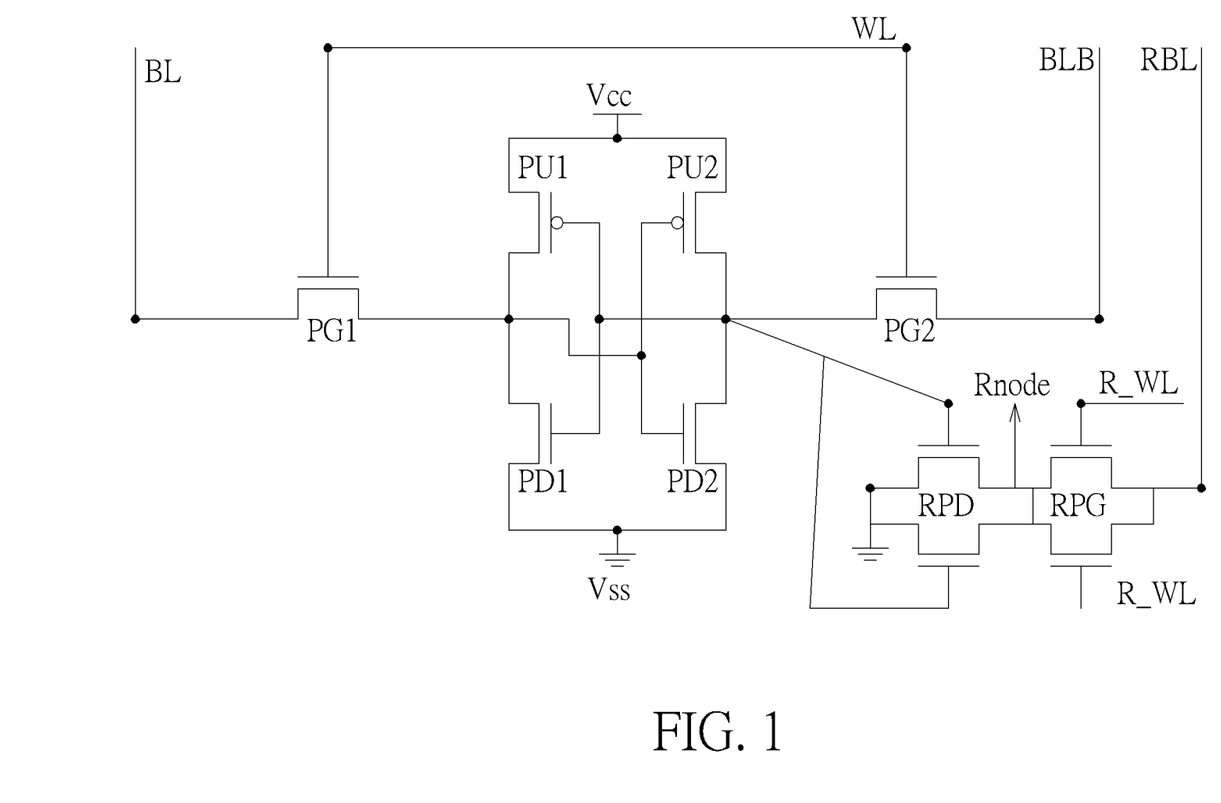
FIG. 1 illustrates a circuit diagram of a ten-transistor SRAM (10T-SRAM) cell according to an embodiment of the present invention.
Figure 2:
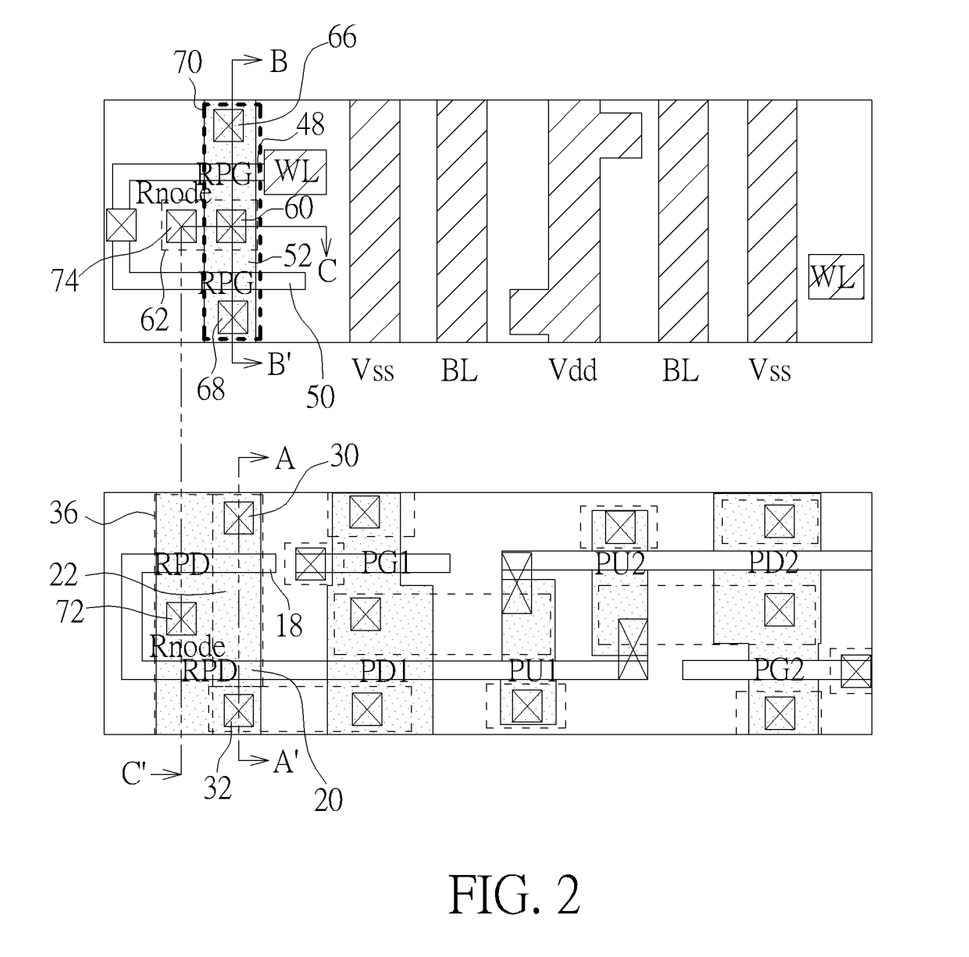
FIG. 2 illustrates a layout diagram of a 10T-SRAM of FIG. 1 according to an embodiment of the present invention.

Referring to FIGS. 1-2, FIG. 1 illustrates a circuit diagram of a ten-transistor SRAM (10T-SRAM) cell according to an embodiment of the present invention and FIG. 2 illustrates a layout diagram of a 10T-SRAM of FIG. 1 according to an embodiment of the present invention. As shown in FIGS. 1-2, the SRAM device of the present invention preferably includes at least one SRAM cell, in which each SRAM cell includes a ten-transistor SRAM (10T-SRAM) cell.

In this embodiment, the 10T-SRAM cell is composed of a first pull-up device PU1, a second pull-up device PU2, a first pull-down device PD1, a second pull-down device PD2, a first pass-gate device PG1, a second pass-gate device PG2, a read port pull-down device RPD made of two transistors, and a read port pass-gate device RPG made of two transistors. Preferably, the first and the second pull-up devices PU1 and PU2 and the first and the second pull-down devices PD1 and PD2 constitute a latch circuit that stores data in the storage nodes. Since the first and the second pull-up devices PU1 and PU2 act as power load devices, they can be replaced by resistors. Under this circumstance, the static random access memory becomes a four-transistor SRAM (4T-SRAM). In this embodiment, the first and the second pull-up devices PU1 and PU2 preferably share a source/drain region and electrically connect to a voltage source (voltage node) Vcc, and the first and the second pull-down devices PD1 and PD2 share a source/drain region and electrically connect to a voltage source (voltage node) Vss.

Preferably, the first and the second pull-up devices PU1 and PU2 of the 10T-SRAM cell are composed of p-type metal oxide semiconductor (PMOS) transistors and the first and the second pull-down devices PD1 and PD2, the first pass-gate device PG1, the second pass-gate device PG2, the read port pull-down device RPD, and the read port pass-gate device RPG are composed of n-type metal oxide semiconductor (NMOS) transistors, but not limited thereto. The first pull-up device PU1 and the first pull-down device PD1 together constitute an inverter, in which one end of the inverter is connected to a voltage source Vcc and the other end of the inverter is connected to a voltage source Vss. Similarly, the second pull-up device PU2 and the second pull-down device PD2 constitute another inverter and one end of the inverter is connected to the voltage source Vcc and the other end of the inverter is connected to the voltage source Vss.

Moreover, the gates of first pass-gate device PG1 and second pass-gate device PG2 are coupled to a word line WL, the source of the first pass-gate device PG1 is coupled to a corresponding bit line (BL, the source of the second pass-gate device PG2 is coupled to a corresponding bit line BLB, one of the gates from read port pull-down device RPD is coupled to the storage node between the second pull-up device PU2 and the second pull-down device PD2, two gates of the read port pass-gate device RPG are coupled to the word lines R_WL, a source of the read port pass-gate device RPG is coupled to the bit line RBL, and both the read port pull-down device RPD and read port pass-gate device RPG are connected to a node Rnode.

In contrast to the conventional 6T-SRAM or 8T-SRAM architectures, the 10T-SRAM of this embodiment preferably incorporates a set of read port pull-down device RPD and a set of read port pass-gate device RPG to allow the memory device to perform read and write operations at the same time. For instance, after a signal is written under conventional 6T-SRAM architecture, the transistors need to be reset before a read operation could be performed. However, by connecting nodes with the read port pull-down device RPD and conventional 6T-SRAM under a 10T-SRAM architecture of this embodiment, it would be desirable to send the signals out through the nodes when a read operation is performed so that both read and write operations could be achieved at the same time.

It should be noted that even though 10T-SRAM architecture has a significantly faster read operation speed than conventional 6T-SRAM or 8T-SRAM structures, the vast area occupied by such devices put them in a major disadvantage during fabrication process and result in waste of space. To resolve this issue the present invention separates the transistors of read port pull-down device RPD and read port pass-gate device RPG into two different levels such as by placing the read port pull-down devices RPDs on the lower portion as shown in FIG. 2 while putting the read port pass-gate devices RPGs on the upper portion so that more space could be saved.

Figure 3:
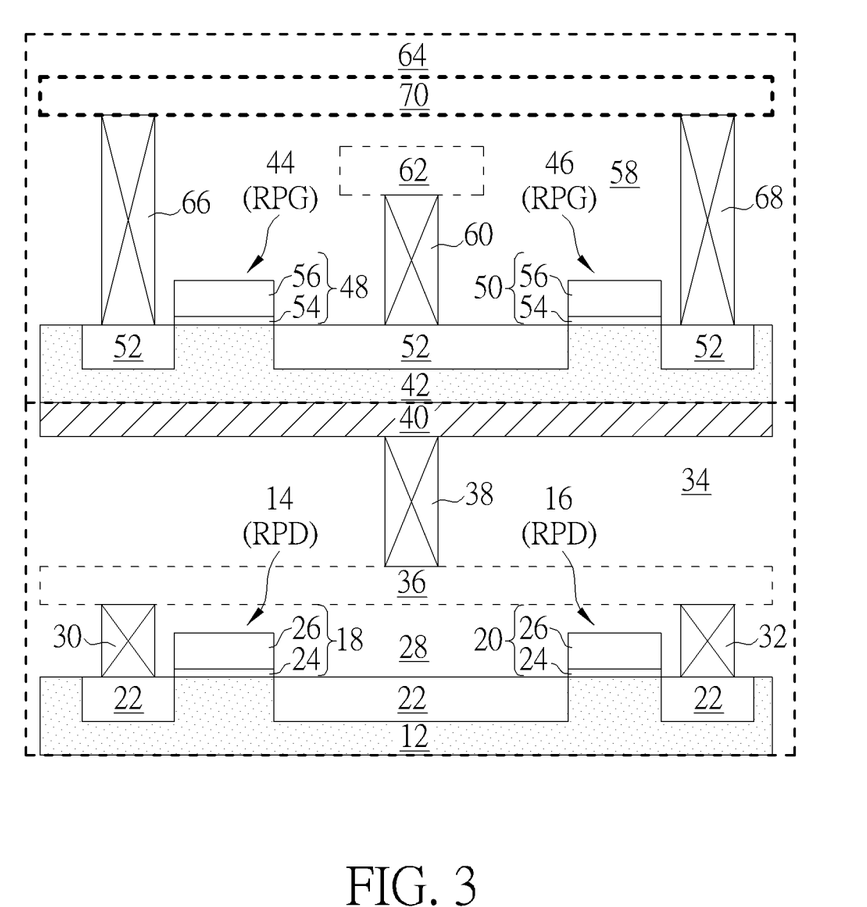
FIG. 3 illustrates a structural view of a SRAM device according to an embodiment of the present invention.
Figure 4:
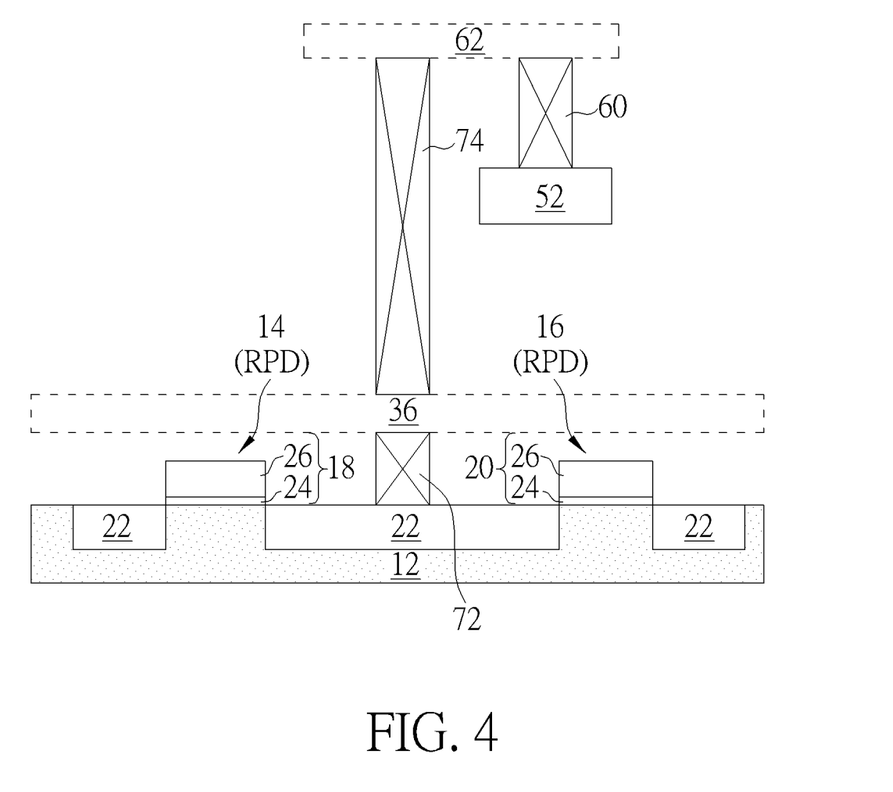
FIG. 4 illustrates a structural view of a SRAM device according to an embodiment of the present invention.

Referring to FIGS. 3-4, FIGS. 3-4 illustrate structural views of a SRAM device according to an embodiment of the present invention, in which the bottom portion of FIG. 3 illustrates a structural view of the read port pull-down device RPD taken along the sectional line AA' in FIG. 2, the top portion of FIG. 3 illustrates a structural view of the read port pass-gate device RPG taken along the sectional line BB' in FIG. 2, and FIG. 4 illustrates a structural view of connecting the read port pull-down device RPD and the read port pass-gate device RPG taken along the sectional line CC' in FIG. 2. As shown in FIGS. 3-4, a substrate 12 is first provided, in which the substrate 12 is a semiconductor substrate made of semiconductor material including but not limited to for example silicon, germanium, silicon-germanium compounds, silicon carbide, or gallium arsenide.

Next, metal-oxide semiconductor (MOS) transistors 14, 16 such as active devices for read port pull-down devices RPDs are formed on the substrate 12 and a dielectric layer such as interlayer dielectric (ILD) layer 28 is formed to cover the MOS transistors 14, 16. Specifically, planar or non-planar (such as FinFET) devices could be formed on the substrate 12, in which the MOS transistors 14, 16 could include gate structure elements such as gate structures 18, 20 on the substrate 12, spacers (not shown) adjacent to the gate structures 18, 20, source/drain regions 22 in the substrate 12 adjacent to two sides of the gate structures 18, 20, and selective epitaxial layer and/or silicides disposed on the surface of the source/drain regions 22.

In this embodiment, each of the gate structures 18, 20 could include a gate dielectric layer 24 and a gate electrode 26, in which the gate dielectric layer 24 preferably includes silicon oxide and the gate electrode 26 could include polysilicon or metal. It should be noted that even though the gate structures 18, 20 include gate electrodes 26 made of polysilicon in this embodiment, according to other embodiments of the present invention it would also be desirable to conduct a replacement metal gate (RMG) process to transform the polysilicon gate structures 18, 20 into metal gates including work function metal layers, which is also within the scope of the present invention. Since the approach of using the RMG process to transform polysilicon gates into metal gates are well known to those skilled in the art, the details of which are not explained herein for the sake of brevity.

Preferably, the spacer could be a single spacer or a composite spacer. For instance, the spacer could further include an offset spacer (not shown) and a main spacer (not shown) and the spacer could be selected from the group consisting of $SiO_2$, SiN, SiON, and SiCN. The source/drain region 22 and epitaxial layer could include different dopants or different material depending on the type of transistor being fabricated. For instance, the source/drain region 22 could include p-type or n-type dopants and the epitaxial layer could include SiGe, SiC, or SiP.

The ILD layer 28 could be disposed on the substrate 12 to cover the MOS transistors 14, 16, and a plurality of contact plugs 30, 32 could be formed in the ILD layer 28 to electrically connect the source/drain regions 22. Next, a metal interconnective process is conducted to form intermetal dielectric (IMD) layer 34 and metal interconnections 36, 38, 40 in the IMD layer 34 to electrically connect the contact plugs 30, 32. In this embodiment, each of the contact plugs 30, 32 and/or metal interconnections 36, 38, 40 could be embedded in the ILD layer 28 and/or IMD layer 34 according to a single damascene process or dual damascene process. Preferably, each of the contact plugs 30, 32 and/or metal interconnections 36, 38, 40 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since the fabrication of planar or non-planar transistor and metal interconnect structures are well known to those skilled in the art, the details of which are not explained herein for the sake of brevity. This completes the fabrication of read port pull-down devices RPDs shown in FIG. 2.

Next, the steps for fabricating the aforementioned read port pull-down devices RPDs could be repeated to form read port pass-gate devices RPGs on the metal interconnection 40. For instance, an epitaxial growth process could be conducted to form another substrate 42 such as a semiconductor substrate made of semiconductor material including but not limited to for example silicon, germanium, silicon-germanium compounds, silicon carbide, or gallium arsenide on the read port pull-down devices RPDs or more specifically on the surface of the metal interconnection 40.

Next, MOS transistors 44, 46 such as active devices for read port pass-gate devices RPGs are formed on the substrate 42 and an ILD layer 58 is formed on the MOS transistors 44, 46. Similar to the elements made previously, planar or non-planar (such as FinFET) devices could be formed on the substrate 42, in which the MOS transistors 44, 46 could include gate structure elements such as gate structures 48, 50 on the substrate 42, spacers (not shown) adjacent to the gate structures 48, 50, source/drain regions 52 in the substrate 42 adjacent to two sides of the gate structures 48, 50, and selective epitaxial layer and/or silicides disposed on the surface of the source/drain regions 52.

Similar to the gate structures 18, 20 in read port pull-down devices RPDs, each of the gate structures 48, 50 could include a gate dielectric layer 54 and a gate electrode 56, in which the gate dielectric layer 54 preferably includes silicon oxide and the gate electrode 56 could include polysilicon or metal. Even though the gate structures 48, 50 include gate electrodes 56 made of polysilicon in this embodiment, according to other embodiments of the present invention it would also be desirable to conduct a replacement metal gate (RMG) process to transform the polysilicon gate structures 48, 50 into metal gates including work function metal layers, which is also within the scope of the present invention. Since the approach of using the RMG process to transform polysilicon gates into metal gates are well known to those skilled in the art, the details of which are not explained herein for the sake of brevity.

Similar to the aforementioned embodiment, the spacer could be a single spacer or a composite spacer. For instance, the spacer could further include an offset spacer (not shown) and a main spacer (not shown) and the spacer could be selected from the group consisting of SiO$_2$, SiN, SiON, and SiCN. The source/drain region 52 and epitaxial layer could include different dopants or different material depending on the type of transistor being fabricated. For instance, the source/drain region 52 could include p-type or n-type dopants and the epitaxial layer could include SiGe, SiC, or SiP.

The ILD layer 58 could be disposed on the substrate 42 to cover the MOS transistors 44, 46, and a plurality of contact plugs 60, 62, 74 could be formed in the ILD layer 58 to electrically connect the source/drain region 52 between the gate structures 48, 50. It should be noted that the metal interconnection 74 adjacent to the metal interconnection 60 preferably serves as a bridge for connecting the source/drain region 22 of the read port pull-down devices RPDs on lower level with the source/drain region 52 of the read port pass-gate devices RPGs on upper level. Moreover, for simplicity purpose and to further demonstrate the elements connected by the metal interconnection 74, the gate structure 50 of read port pass-gate device RPG on upper level adjacent to the metal interconnection 74 is omitted in FIG. 4.

Next, a metal interconnective process is conducted to form inter-metal dielectric (IMD) layer 64 and contact plugs or metal interconnections 66, 68, 70 in the IMD layer 64 to electrically connect the source/drain regions 52 adjacent to two sides of the gate structures 48, 50. In this embodiment, each of the metal interconnections 60, 62, 66, 68, 70 could be embedded in the ILD layer 58 and/or IMD layer 64 according to a single damascene process or dual damascene process. Preferably, each of the metal interconnections 60, 62, 66, 68, 70 could further includes a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of read port pass-gate devices RPGs shown in FIG. 2.

It should be noted that in alternative to conducting an epitaxial growth process for forming a substrate 42 made of semiconductor material on the fabricated read port pull-down devices RPDs on the lower level and then carrying out the fabrication of read port pass-gate devices RPGs on upper level afterwards, according to another embodiment of the present invention it would also be desirable to carry out the fabrication of read port pass-gate devices RPGs on another substrate 42 or silicon wafer made of semiconductor material after the fabrication of read port pull-down devices RPDs is completed, complete the fabrication of all device elements including gate structures, source/drain regions, ILD layer, IMD layer, and metal interconnections, and then bond the substrate 42 carrying read port pass-gate devices RPGs onto the read port pull-down devices RPDs or more specifically onto the surface of the metal interconnection 40 through a bonding process, which is also within the scope of the present invention. Moreover, if the lower level read port pull-down devices RPDs and upper level read port pass-gate devices RPGs were connected through bonding process, it would be desirable to form bumps or through-silicon vias (TSVs) for transmitting signals between the two devices depending on the demand of the products, which are all within the scope of the present invention.

Overall, since current 10T-SRAM architecture despite having significantly faster read operation speed than conventional 6T-SRAM or 8T-SRAM structures still occupies a vast amount of area resulting in waste of space, the present invention preferably separates the transistors of read port pull-down device RPD and read port pass-gate device RPG into two different levels by placing the read port pull-down devices RPDs on the lower level while putting the read port pass-gate devices RPGs on the upper level as shown in FIGS. 2-3 so that more space could be saved. As stated previously, the present invention first conducts the fabrication of read port pull-down devices RPDs on the substrate 12, conducts an epitaxial growth process to form the substrate 42 on the surface of the uppermost metal interconnection atop the read port pull-down devices RPDs, and then carries out the fabrication of read port pass-gate devices RPGs on the substrate 42. Alternatively, it would also be desirable to first conduct the fabrication of read port pull-down devices RPDs on the substrate 12, conduct the fabrication of read port pass-gate devices RPGs on the substrate 42 or silicon wafer also made of semiconductor material, and then bond the substrate 42 carrying the fabricated read port pass-gate devices RPGs onto the topmost metal layer of the read port pull-down devices RPDs, which are also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a static random access memory (SRAM), comprising:

forming a first metal-oxide semiconductor (MOS) transistor on a first substrate, wherein the first MOS transistor comprises:
a first gate structure on the first substrate; and
a first source/drain region and a second source/drain region adjacent to two sides of the first gate structure in the first substrate and arranged along a first direction;
forming a first interlayer dielectric (ILD) layer on the first MOS transistor;
forming a first contact plug connected to the first source/drain region;
forming a first inter-metal dielectric (IMD) layer on the first ILD layer;
forming a first metal interconnection in the first IMD layer;
forming a second substrate on the first metal interconnection, wherein a bottom surface of the second substrate contacts the first metal interconnection directly;
forming a second MOS transistor on a top surface of the second substrate, wherein the second MOS transistor comprises:
a third gate structure on the second substrate; and
a fourth source/drain region and a fifth source/drain region adjacent to two sides of the third gate structure in the second substrate;
forming a second metal interconnection connected to the fifth source/drain region;
forming a third metal interconnection adjacent to the third gate structure and connected to the fourth source/drain region;
forming a fifth metal interconnection above the second metal interconnection, wherein the fifth metal interconnection has a first portion and a second portion arranged along a second direction orthogonal to the first direction, in a top view of the SRAM, the first portion overlaps the fifth source/drain region, and the second portion overlaps the second source/drain region; and
forming a sixth metal interconnection adjacent to the second metal interconnection, wherein the second metal interconnection vertically connected between the first portion and the fifth source/drain region, and the sixth metal interconnection vertically connected between the second portion and the second source/drain region; wherein one of the first MOS transistor and the second MOS transistor is a transistor of a read port pull-down device, and the other one of the first MOS transistor and the second MOS transistor is a transistor of a read port pass-gate device, and the first substrate, the first source/drain region, the first contact plug, the first metal interconnection, the second substrate, the fourth source/drain region and the third metal interconnection are arranged sequentially from bottom to top.

2. The method of claim 1, further comprising:
forming the first MOS transistor and a third MOS transistor on the first substrate; and
forming the first ILD layer on the first MOS transistor and the third MOS transistor.

3. The method of claim 2, further comprising:
forming the second MOS transistor and a fourth MOS transistor on a second substrate; and
forming a second ILD layer on the second MOS transistor and the fourth MOS transistor.

4. The method of claim 3, further comprising forming the second substrate on the first ILD layer before forming the second MOS transistor.

5. The method of claim 3, further comprising bonding the second substrate on the first ILD layer after forming the second ILD layer on the second MOS transistor.

6. The method of claim 3, further comprising:
forming the first gate structure and a second gate structure on the first substrate;
forming the first source/drain region adjacent to the first gate structure, the second source/drain region between the first gate structure and the second gate structure, and a third source/drain region adjacent to the second gate structure;
forming the first ILD layer on the first gate structure and the second gate structure;
forming the first contact plug adjacent to the first gate structure;
forming the first inter-metal dielectric (IMD) layer on the first ILD layer; and
forming the first metal interconnection in the first IMD layer.

7. The method of claim 6, further comprising forming the first metal interconnection between the first gate structure and the second gate structure.

8. The method of claim 6, further comprising:
forming the third gate structure and a fourth gate structure on the second substrate;
forming the fourth source/drain region adjacent to the third gate structure, the fifth source/drain region between the third gate structure and the fourth gate structure, and a sixth source/drain region adjacent to the fourth gate structure; and
forming the second ILD layer on the third gate structure and the fourth gate structure.

9. The method of claim 8, further comprising:
forming the second metal interconnection between the third gate structure and the fourth gate structure and connected to the fifth source/drain region;
forming a second inter-metal dielectric (IMD) layer on the second ILD layer;
forming the third metal interconnection adjacent to the third gate structure and connected to the fourth source/drain region; and
forming a fourth metal interconnection adjacent to the fourth gate structure and connected to the sixth source/drain region.

10. The method of claim 1, wherein the SRAM further comprises:
a first pull-up device;
a second pull-up device;
a first pull-down device;
a second pull-down device;
a first pass-gate device; and
a second pass-gate device.

11. The method of claim 1, wherein the read port pull-down device comprises the first MOS transistor.

12. The method of claim 1, wherein the read port pass-gate device comprises the second MOS transistor.

13. A static random access memory (SRAM), comprising:
a first metal-oxide semiconductor (MOS) transistor on a first substrate, wherein the first MOS transistor comprises:
a first gate structure on the first substrate; and
a first source/drain region and a second source/drain region adjacent to two sides of the first gate structure in the first substrate and arranged along a first direction;
a first interlayer dielectric (ILD) layer on the first MOS transistor;

a first contact plug connected to the first source/drain region;
a first inter-metal dielectric (IMD) layer on the first ILD layer;
a first metal interconnection in the first IMD layer;
a second substrate on the first metal interconnection, wherein a bottom surface of the second substrate contacts the first metal interconnection directly;
a second MOS transistor on a top surface of the second substrate, wherein the second MOS transistor comprises:
  a third gate structure on the second substrate; and
  a fourth source/drain region and a fifth source/drain region adjacent to two sides of the third gate structure in the second substrate;
a second metal interconnection connected to the fifth source/drain region;
a third metal interconnection adjacent to the third gate structure and connected to the fourth source/drain region;
a fifth metal interconnection above the second metal interconnection, wherein the fifth metal interconnection has a first portion and a second portion arranged along a second direction orthogonal to the first direction, in a top view of the SRAM, the first portion overlaps the fifth source/drain region, and the second portion overlaps the second source/drain region; and
a sixth metal interconnection adjacent to the second metal interconnection, wherein the second metal interconnection vertically connected between the first portion and the fifth source/drain region, and the sixth metal interconnection vertically connected between the second portion and the second source/drain region; wherein one of the first MOS transistor and the second MOS transistor is a transistor of a read port pull-down device, and the other one of the first MOS transistor and the second MOS transistor is a transistor of a read port pass-gate device, and the first substrate, the first source/drain region, the first contact plug, the first metal interconnection, the second substrate, the fourth source/drain region and the third metal interconnection are arranged sequentially from bottom to top.

14. The SRAM of claim 13, further comprising:
the first gate structure and a second gate structure on the first substrate; and
the first source/drain region adjacent to the first gate structure, the second source/drain region between the first gate structure and the second gate structure, and a third source/drain region adjacent to the second gate structure.

15. The SRAM of claim 14, further comprising:
the first contact plug adjacent to the first gate structure;
the first inter-metal dielectric (IMD) layer on the first ILD layer; and
the first metal interconnection in the first IMD layer.

16. The SRAM of claim 15, further comprising:
the third gate structure and a fourth gate structure on the second substrate; and
the fourth source/drain region adjacent to the third gate structure, the fifth source/drain region between the third gate structure and the fourth gate structure, and a sixth source/drain region adjacent to the fourth gate structure.

17. The SRAM of claim 16, further comprising:
the second metal interconnection between the third gate structure and the fourth gate structure and connected to the fifth source/drain region;
a second inter-metal dielectric (IMD) layer on the second ILD layer;
the third metal interconnection adjacent to the third gate structure and connected to the fourth source/drain region; and
a fourth metal interconnection adjacent to the fourth gate structure and connected to the sixth source/drain region.

18. The SRAM of claim 13, further comprising:
a first pull-up device;
a second pull-up device;
a first pull-down device;
a second pull-down device;
a first pass-gate device; and
a second pass-gate device.

19. The SRAM of claim 13, wherein the read port pull-down device comprises the first MOS transistor.

20. The SRAM of claim 13, wherein the read port pass-gate device comprises the second MOS transistor.

* * * * *